United States Patent [19]
Park

[11] Patent Number: 5,986,998
[45] Date of Patent: Nov. 16, 1999

[54] OPTICAL HEAD HAVING TWO VERTICAL CAVITY SURFACE EMITTING LASERS WITH DIFFERENT WAVELENGTHS

[75] Inventor: Soo-han Park, Suwon, Rep. of Korea

[73] Assignee: Samsung Electronics Co., Ltd., Kyungki-do, Rep. of Korea

[21] Appl. No.: 08/956,532

[22] Filed: Oct. 23, 1997

[30] Foreign Application Priority Data

Oct. 24, 1996 [KR] Rep. of Korea ..................... 96-48145

[51] Int. Cl.[6] .............................. G11B 7/00; H01S 3/19
[52] U.S. Cl. .................. 369/121; 369/44.23; 369/44.37; 369/94; 369/122; 372/43; 372/50
[58] Field of Search .................................. 369/121, 122, 369/116, 120, 44.23, 84, 44.37, 44.42; 372/29, 33, 50, 36, 102, 43, 45, 92, 96

[56] References Cited

U.S. PATENT DOCUMENTS

| | | | |
|---|---|---|---|
| 5,034,958 | 7/1991 | Kwon et al. | 372/45 |
| 5,325,386 | 6/1994 | Jewell et al. | 372/50 |
| 5,386,428 | 1/1995 | Thornton et al. | 372/50 |
| 5,406,543 | 4/1995 | Kobayashi et al. | 369/121 |
| 5,513,164 | 4/1996 | Tanaka et al. | 369/112 |
| 5,541,909 | 7/1996 | Nakajima et al. | 369/275.1 |
| 5,663,944 | 9/1997 | Mun | 369/121 |
| 5,703,856 | 12/1997 | Hayashi et al. | 369/54 |
| 5,707,139 | 1/1998 | Haitz | 362/231 |
| 5,732,101 | 3/1998 | Shin | 372/92 |
| 5,757,741 | 5/1998 | Jiang et al. | 369/44.12 |
| 5,784,396 | 7/1998 | Guerin | 372/29 |
| 5,802,037 | 9/1998 | Lee et al. | 369/120 |
| 5,835,517 | 11/1998 | Jayaraman et al. | 372/50 |
| 5,874,730 | 2/1999 | Yi et al. | 369/121 |

FOREIGN PATENT DOCUMENTS

| | | | |
|---|---|---|---|
| 4-93922 | 8/1992 | Japan | G11B 7/125 |
| 6-259804 | 9/1994 | Japan | G11B 7/135 |
| 9-138967 | 5/1997 | Japan | G11B 7/135 |
| 10-124903 | 5/1998 | Japan | G11B 7/125 |
| 2 313 229 | 11/1997 | United Kingdom | G11B 7/125 |

*Primary Examiner*—Tan Dinh
*Assistant Examiner*—Kim-Kwok Chu
*Attorney, Agent, or Firm*—Sughrue, Mion, Zinn, Macpeak & Seas, PLLC

[57] ABSTRACT

An optical pickup which can be employed for different formats of a disk recording medium is disclosed. The optical pickup device includes a light source including first and second vertical cavity surface emitting lasers closely disposed to each other for emitting light having different wavelengths and different radiation angles, an objective lens for focusing the light emitted from the light source on a recording surface of a recording medium, a photodetector for detecting information signals and error signals by receiving the light reflected from the recording medium, a polarized beam splitter disposed on an optical path between the light source and the objective lens to redirect a proceeding path of incident light, and a wavelength plate disposed on the optical path between the objective lens and the polarized beam splitter to convert a polarization component of incident light.

4 Claims, 4 Drawing Sheets

OPTICAL HEAD HAVING TWO VERTICAL CAVITY SURFACE EMITTING LASERS WITH DIFFERENT WAVELENGTHS

BACKGROUND OF THE INVENTION

The present invention relates to an optical pickup device, and more particularly, to an optical pickup device which can be employed for different formats of a disk recording medium.

In general, an optical pickup device records and reproduces information on and from a recording medium in a non-contact manner by being employed in a compact disk player (CDP), a digital video disk player (DVDP), a CD-ROM driver, and a DVD-ROM driver.

The optical pickup device employed by a DVDP which enables high density recording/reproducing of information is required to be compatible for the compact disk (hereinafter called CD) family, such as a CD (compact disk), a CD-R (CD-Recordable), CD-I (CD-Interactive) and a CD-G (CD-Graphical), not only a DVD (digital video disk).

The thickness of the DVD differs from that of the CD due to differing mechanical disk inclination allowances and the numerical apertures of an objective lens of the respective standards. That is, the thickness of the conventional CD is 1.2 mm, whereas that of the DVD is 0.6 mm. Since the thicknesses of the CD and DVD are different from each other, when an optical pickup device for a DVD is used to reproduce information recorded on a CD, spherical aberration due to the difference in the thicknesses occurs. Thus, a sufficient light intensity required for recording information is not obtained, or deterioration occurs in the reproduced signal. Also, the wavelength standards of the reproduced light for a DVD differs from that for a CD. That is, the wavelength of the conventional CD reproduction light is approximately 780 nm, whereas that of the DVD is approximately 650 nm.

In consideration of the above points, optical pickup devices compatible for multiple formats have been suggested. These optical pickup devices focus on overcoming such problems caused by the differences between the disk formats, and use a single light source. That is, a light source emitting light of a short wavelength of approximately 650 nm which is appropriate for a DVD format, is employed. In this case, deterioration in the reproduced signal increases about 5% relative to an optical pickup employing a light source emitting light of about 780 nm, which is within the reproduction allowance, causing little problem.

However, when a CD-R is employed as a recording medium, there is a difference in sensitivities between a light source emitting light of approximately 650 nm and a light source emitting light of approximately 780 nm, as shown in FIG. 1. Since the CD-R has an organic dye film recording layer, when using the light of 650 nm, signals are not reproduced by a low reflection ratio of a disk due to the difference in sensitivities.

To overcome such a problem, as shown in FIG. 2, another conventional optical pickup employing two light sources has been suggested. Referring to FIG. 2, a first light source 21 for a disk 10a having a relatively thin thickness, e.g., a DVD, emits light of approximately 635 nm, and a second light source 31 for a disk 10b having a relatively thick thickness, e.g., a CD, emits light of 780 nm.

The light emitted from the first light source 21 is reflected by a polarized beam splitter 23 and sequentially passes through an interference filter 33, a ¼ phase delay plate 11 and a holographic device 13. Also, the optical path of the light emitted from the second light source 31 is converted by the interference filter 33 and then the light passes through the ¼ phase delay plate 11 and the holographic device 13. A predetermined diffraction pattern 13a is formed at a central portion of the holographic device 13. Since the light emitted from the first light source 21 is input with a radius greater than that of the diffraction pattern 13a, the light becomes a 0-th order diffracted light which is not diffracted while passing through the holographic device 13 and is focused on the relatively thin disk 10a. Meanwhile, the light emitted from the second light source 31 is diffracted by the diffraction pattern 13a of the holographic device 13 to a predetermined degree to be a +1st order diffracted light so that the light is focused on the relatively thick disk 10b. The light after passing through the holographic device 13 is focused on the disk 10 by an objective lens 15.

Such an optical pickup device can be used when a CD-R is employed as a recording medium. However, it is difficult to assemble and arrange the holographic device 13 in which the diffraction pattern 13a is formed and the optical efficiency of the +1st order diffracted light diffracted by the holographic device is drastically reduced by 34% with respect to a case in which the holographic device is not employed.

SUMMARY OF THE INVENTION

To overcome the above problems, it is an objective of the present invention to provide an optical pickup device compatible for multiple disk formats having a simplified structure and improving the efficiency of light thereof.

Accordingly, to achieve the above objective, there is provided an optical pickup which comprises a light source including first and second vertical cavity surface emitting lasers closely disposed to each other for emitting light having different wavelengths and different radiation angles, an objective lens for focusing the light emitted from the light source on a recording surface of a recording medium, a photodetector for detecting information signals and error signals by receiving the light reflected from the recording medium, a polarized beam splitter disposed on an optical path between the light source and the objective lens to redirect a proceeding path of incident light, and a wavelength plate disposed on the optical path between the objective lens and the polarized beam splitter to convert a polarization component of incident light.

It is preferable in the present invention that each of the first and second vertical cavity surface emitting lasers comprises a substrate, a lower electrode layer deposited on the substrate, a lower reflection layer composed of a plurality of layers formed on the lower electrode layer, the lower electrode layer being formed of a semiconductor material containing dopants, an active layer formed on the lower reflection layer and generating a laser beam, an upper reflection layer composed of a plurality of layers formed on the active layer, the upper electrode layer being formed of semiconductor material containing dopants which is a different semiconductor type from the lower reflection layer, and an upper electrode layer formed on the upper surface of the upper reflection layer and having a window through which light generated from the active layer is emitted.

Also, it is preferable in the present invention that the first vertical cavity surface emitting laser emits light of the red wavelength region and the second vertical cavity surface emitting laser emits light of the infrared wavelength region, and the window of the first vertical cavity surface emitting laser is formed to be greater than that of the second vertical cavity surface emitting laser so that the radiation angle of light emitted from the second vertical cavity surface emitting laser is greater than that of light emitted from the first vertical cavity surface emitting laser.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

Figure 1:
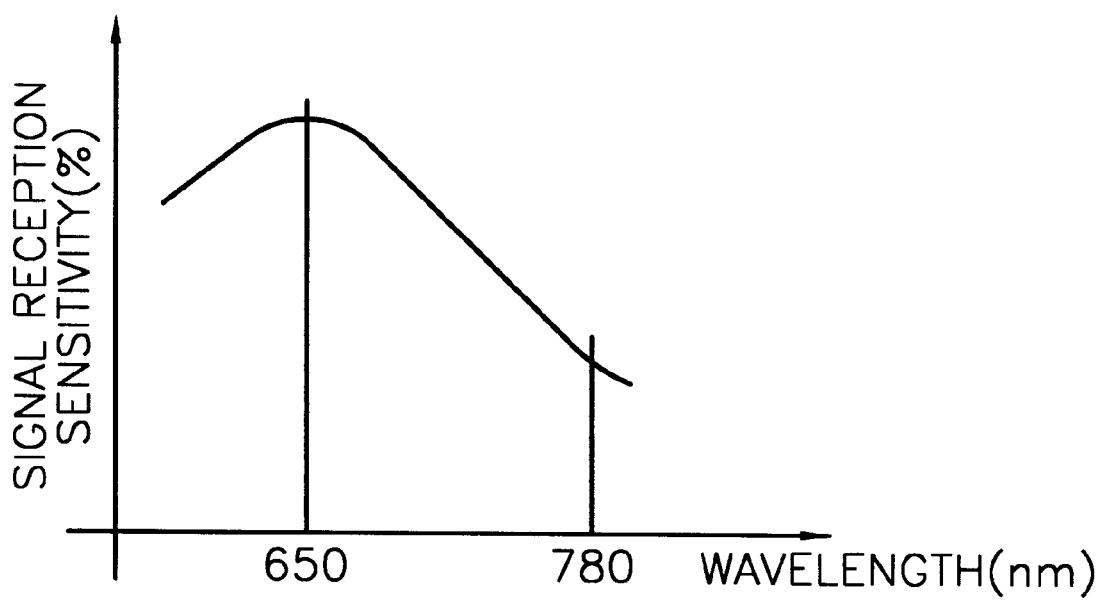
FIG. 1 is a graph indicating sensitivity according to the wavelength of a light source when a CD-R is employed as a recording medium.
Figure 2:
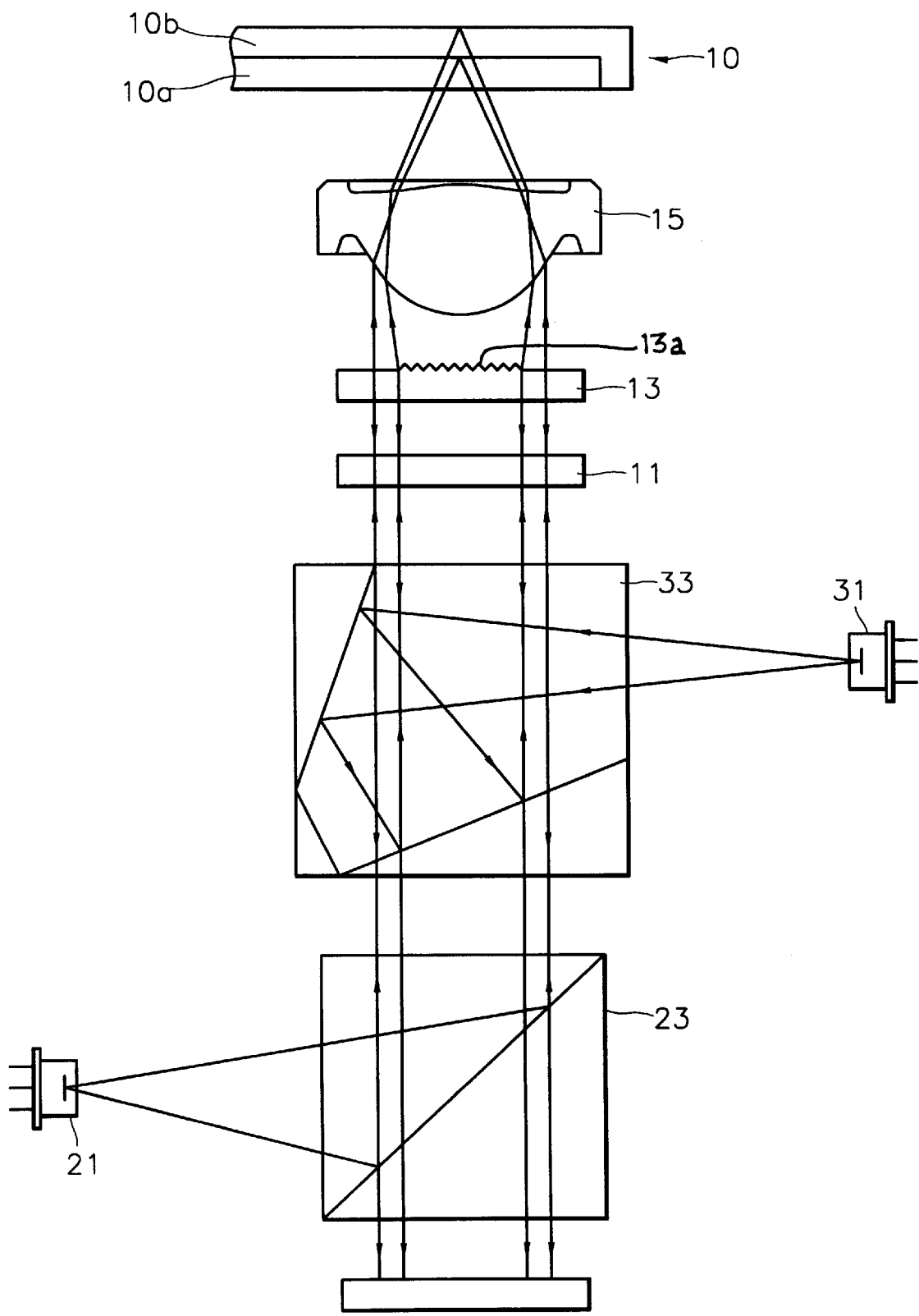
FIG. 2 is a diagram showing the optical arrangement of a conventional optical pickup device compatible for multiple disk formats.
Figure 3:
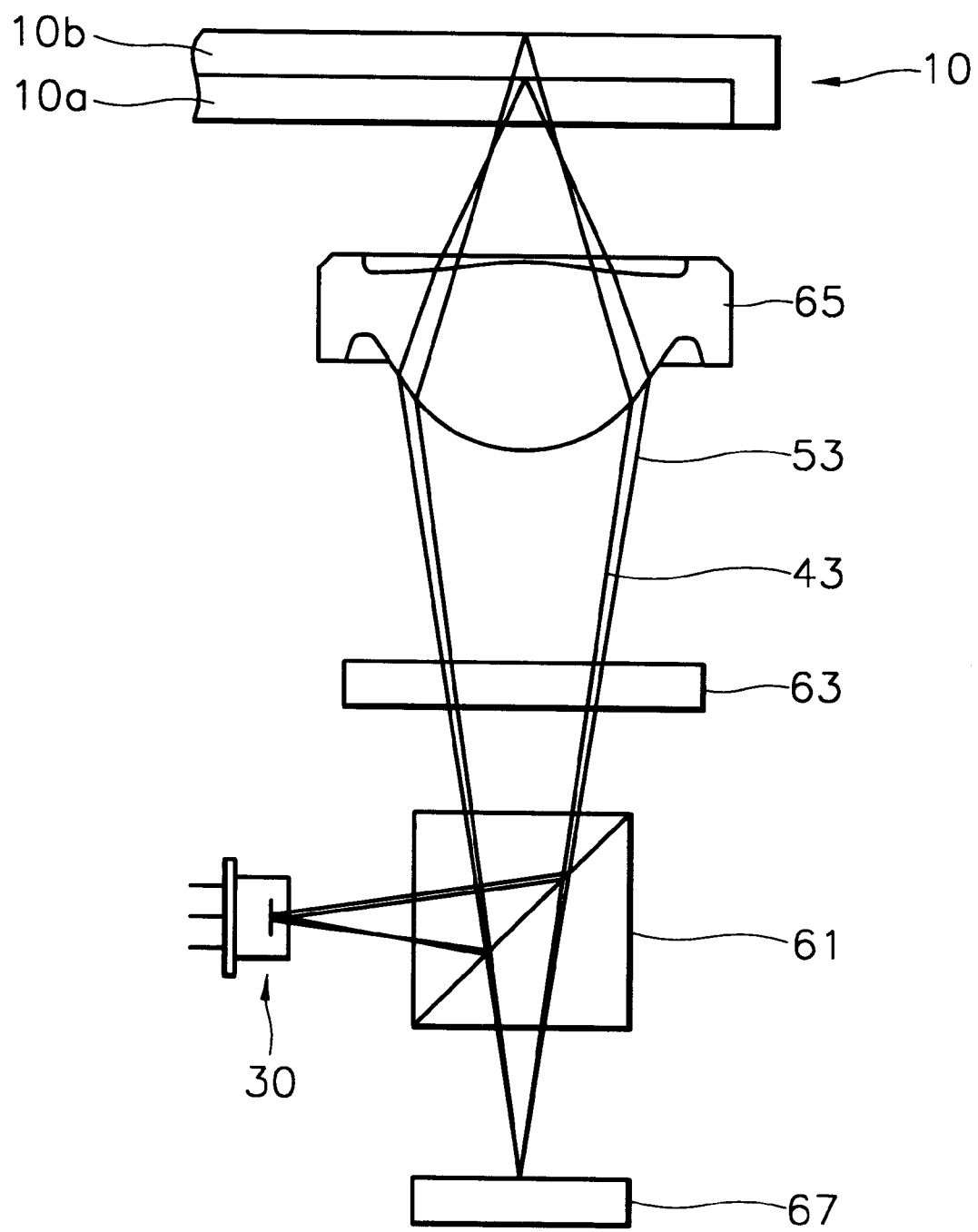
FIG. 3 is a diagram showing the optical arrangement of an optical pickup device compatible for multiple disk formats according to a preferred embodiment of the present invention.

As shown in FIG. 3, the present invention includes a light source 30, a polarized beam splitter 61 for converting a proceeding path of an input light according to a polarization direction, an objective lens 65 for concentrating the light input from the light source 30 on a recording surface of a recording medium 10, a wavelength plate 63 disposed between the polarized beam splitter 61 and the objective lens 65 for converting an input light's linear polarization component to a circular polarization component, and a photodetector 67 for receiving the light reflected from the recording medium 10 and passing through the polarized beam splitter 61.

Figure 4:
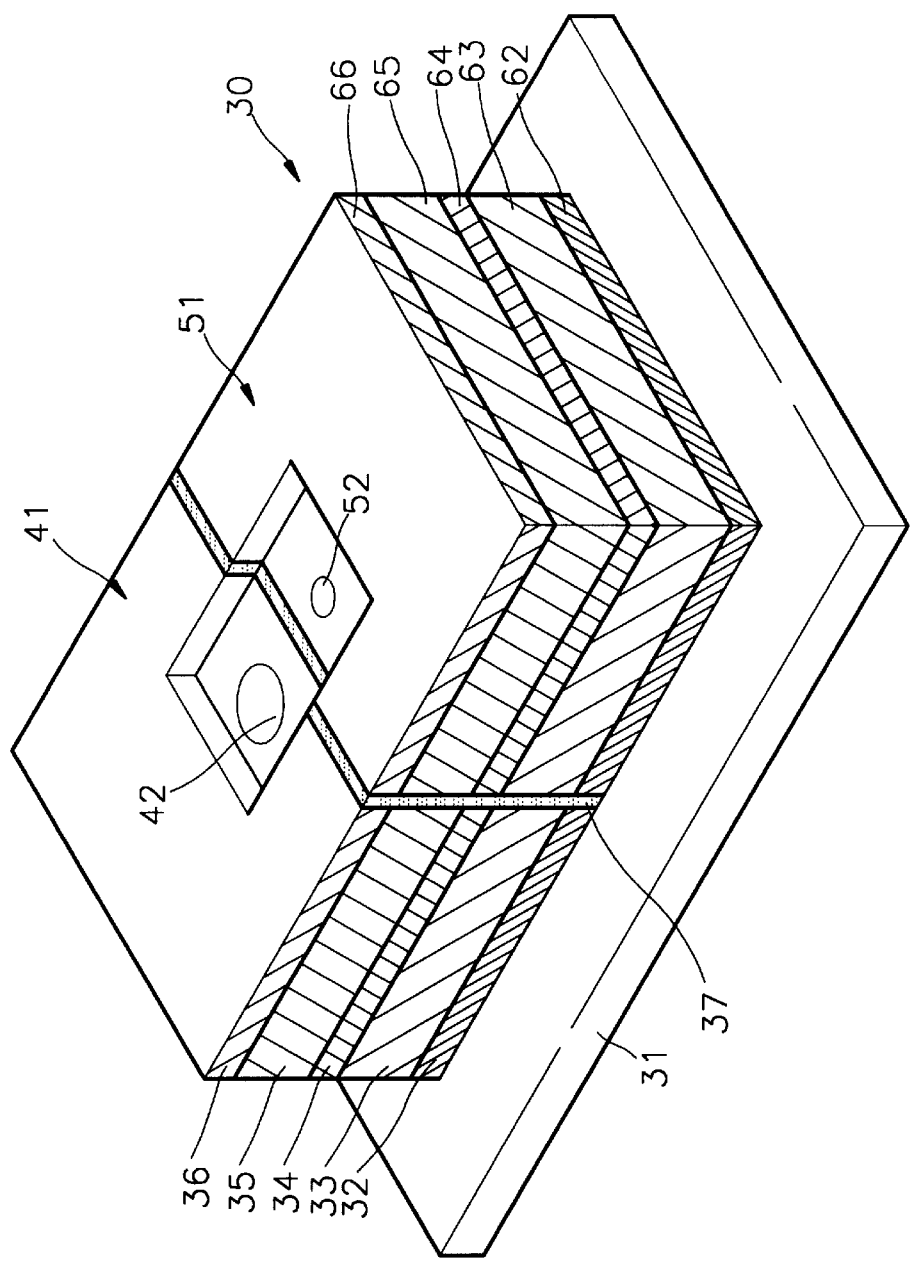
FIG. 4 is a perspective view of the light source of FIG. 3.

As shown in FIG. 4, the light source 30 is comprised of a substrate 31 and first and second vertical cavity surface emitting lasers (VCSEL) 41 and 51 arranged close to each other on the substrate 31. Generally, the VCSEL emitting light in a direction in which the semiconductor material layers are stacked facilitates the arrangement of the structure. Here, since the sizes of the first and second VCSELs 41 and 51 are within tens of micrometers ($\mu$m), aberrations caused by emitting light from different positions are negligible.

The first VCSEL 41 emits infrared light of approximately 780 nm which is appropriate for a CD which is a relatively thick disk 10b (see FIG. 3), in particular a CD-R. The second VOSEL 51 emits infrared light of approximately 635–650 nm which is appropriate for a relatively thin disk 10a, in particular a DVD or DVD-ROM.

The first and second VCSELs 41 and 51 each includes a lower electrode layer 32 and 62, a lower reflection layer 33 and 63, an active layer 34 and 64, an upper reflection layer 35 and 65 and an upper electrode layer 36 and 66, which are deposited on the substrate 31 in said order. The lower reflection layers 33 and 63 and the upper reflection layers 36 and 66 are formed by alternately depositing a semiconductor compound formed of $Al_xGa_{1-x}As$ containing dopant and a compound formed of GaAs forming a multitude of layers. However, the lower reflection layers 33 and 63 and the upper reflection layers 35 and 65 are formed of dopant semiconductor material of a different type. For example, the lower reflection layers 33 and 63 are n-type semiconductor material and the upper reflection layers 35 and 65 are p-type semiconductor material, or vice versa.

The lower reflection layers 33 and 63 and the upper reflection layers 35 and 65 each have a high reflection ratio over 99% and each reflects most of the light generated from the active layers 34 and 64 while allowing a very small portion of the light to pass therethrough.

The lower electrode layers 32 and 62 and the upper electrode layers 36 and 66 are each metals exhibiting superior electrical conductivity. A positive voltage with respect to the lower electrode layers 32 and 62 is applied from an external power source (not shown) to the upper electrode layers 36 and 66.

Windows 42 and 52 are formed on the upper electrode layers 36 and 66, from which a laser beam generated from the active layers 34 and 64 and passed through the upper reflection layers 35 and 65 is emitted. Here, the radiation angle of a beam 43 (see FIG. 3) emitted from the first VCSEL 41 is relatively less than the radiation angle of a beam 53 emitted from the second VCSEL 51. That is, since the radiation angle of the emitting beam is reversely proportional to the diameter of the window 42 and 52, the diameter of the window 42 of the first VCSEL 41 is formed to be greater than that of the window 52 of the second VCSEL 51.

The first and second VCSELs 41 and 51 are manufactured in the same manufacturing process and are electrically insulated by an isolating plate 37 interposed between the first and second VCSELs 41 and 51.

Referring to FIG. 3, the objective lens 65 is driven by being mounted on an actuator (not shown) to correct focus errors or tracking errors. The objective lens 65 focuses incident light to make the focal point of the light input to a far-axis region differ from the focal point of the light input to a near-axis region by a spherical aberration thereof. Thus, the beam 43 having a small radiation angle emitted from the first VCSEL 41 passes through the polarized beam splitter 61, the wavelength plate 63 and the near-axis region of the objective lens 65 to form a light spot on a relatively thick disk 10b. Meanwhile, the beam 53 having a large radiation angle emitted from the second VCSEL 51 passes through the polarized beam splitter 61, the wavelength plate 63 and the far-axis region of the objective lens 65 to form a light spot on a relatively thin disk 10a.

The polarized beam splitter 61 allows rays in one polarization direction of the incident light to pass therethrough while converting a proceeding path of the incident light by reflecting the light in the other polarization direction of the incident light.

It is preferable that the wavelength plate 63 is a $\lambda/4$ wavelength delay plate which converts linearly polarized incident rays into circular polarized rays and circular polarized incident rays into linearly polarized rays.

The light reflected from the recording medium 10 passes through the objective lens 65 and the wavelength plate 63 and is converted into light having a different polarization component from the light emitted from the light source 30. The converted light passes through the polarized beam splitter 61 and is focused on the photodetector 67 so that an information signal and error signals are detected.

As described above, in the optical pickup device compatible for multiple disk formats according to the present invention, two VCSELs are adopted as a light source and the polarized beam splitter acts to redirect the optical path so that disks having a different thickness can be compatibly accommodated while obtaining high optical efficiency. Also, when a CD-R is employed as a recording medium, destruction of data can be prevented by utilizing light in the red wavelength region. Further, by using an integrated light source without using an optical device such as holographic device, miniaturization and low manufacturing costs can be realized.

While the above embodiment of the invention has been shown and described, it will be obvious to one skilled in the art that changes and modifications can be made without departing from the spirit and scope of the invention as defined in the appended claims.

What is claimed is:

1. An optical pickup comprising:

a light source including first and second vertical cavity surface emitting lasers disposed adjacent to each other on a substrate for emitting light having different wavelengths and different divergence angles;

an objective lens for focusing the light emitted from said light source on a recording surface of a recording medium;

a photodetector for detecting information signals and error signals by receiving the light reflected from said recording medium;

a polarized beam splitter disposed on an optical path between said light source and said objective lens to redirect a proceeding path of incident light;

a wavelength plate disposed on the optical path between said objective lens and said polarized beam splitter to convert a linear polarization component of said incident light to a circular polarization component of said incident light; and an isolating plate which is interposed between said first vertical cavity surface emitting laser and said second vertical cavity surface emitting laser to electrically insulate said first and second vertical cavity surface emitting lasers.

2. The optical pickup device as claimed in claim 1, wherein each of said first and second vertical cavity surface emitting lasers comprises:

a substrate;

a lower electrode layer deposited on said substrate;

a lower reflection layer composed of a plurality of layers formed on said lower electrode layer, said lower reflection layer being formed of a semiconductor material containing dopants;

an active layer formed on said lower reflection layer and generating a laser beam;

an upper reflection layer composed of a plurality of layers formed on said active layer, said upper reflection layer being formed of semiconductor material containing dopants of a different semiconductor type from said lower reflection layer; and an upper electrode layer formed on the upper surface of said upper reflection layer and having a window through which light generated from said active layer is emitted.

3. The optical pickup device as claimed in claim 1, wherein said wavelength plate is a $\lambda/4$ wavelength delay plate which converts linearly polarized incident light into circular polarized light and also circular polarized incident light into linearly polarized light.

4. The optical pickup device as claimed in claim 1, wherein said first vertical cavity surface emitting laser emits light of the red wavelength region and said second vertical cavity surface emitting laser emits light of the infrared wavelength region, and the window of said first vertical cavity surface emitting laser is formed to be greater than that of said second vertical cavity surface emitting laser so that the radiation angle of light emitted from said second vertical cavity surface emitting laser is greater than that of light emitted from said first vertical cavity surface emitting laser.

* * * * *